United States Patent [19]

Joo

[11] Patent Number: 5,596,538
[45] Date of Patent: Jan. 21, 1997

[54] SEMICONDUCTOR MEMORY DEVICE

[75] Inventor: Yang S. Joo, Seoul, Rep. of Korea

[73] Assignee: LG Semicon Co., Ltd., Choongchungbook-do, Rep. of Korea

[21] Appl. No.: 566,668

[22] Filed: Dec. 4, 1995

[30] Foreign Application Priority Data

Dec. 8, 1994 [KR] Rep. of Korea .................. 33224/1994

[51] Int. Cl.$^6$ ...................................... G11C 7/00
[52] U.S. Cl. .................. 365/201; 365/225.7; 365/194
[58] Field of Search ..................... 365/201, 225.7, 365/194, 205, 207, 208

[56] References Cited

U.S. PATENT DOCUMENTS 4,281,398  7/1981  McKenny et al. ............... 365/200
5,305,267  4/1994  Haraguchi et al. .............. 365/225.7
5,355,344  10/1994 McClure ........................... 365/225.7

Primary Examiner—Viet Q. Nguyen
Assistant Examiner—Vũ A. Lê
Attorney, Agent, or Firm—Morgan, Lewis and Bockius LLP

[57] ABSTRACT

In a semiconductor memory device, data required for controlling design margins and access time is stored at a selected fuse ROM array and a vendor test is performed. By using the information obtained by the vendor testing, fuse ROM arrays are programed, so that design margins and access time can be easily varied according to semiconductor memory device, thereby enhancing the device performance. Moreover, by additionally adapting a multiplexer, a plurality of fuse ROM arrays can be programmed by using a few pads.

5 Claims, 4 Drawing Sheets

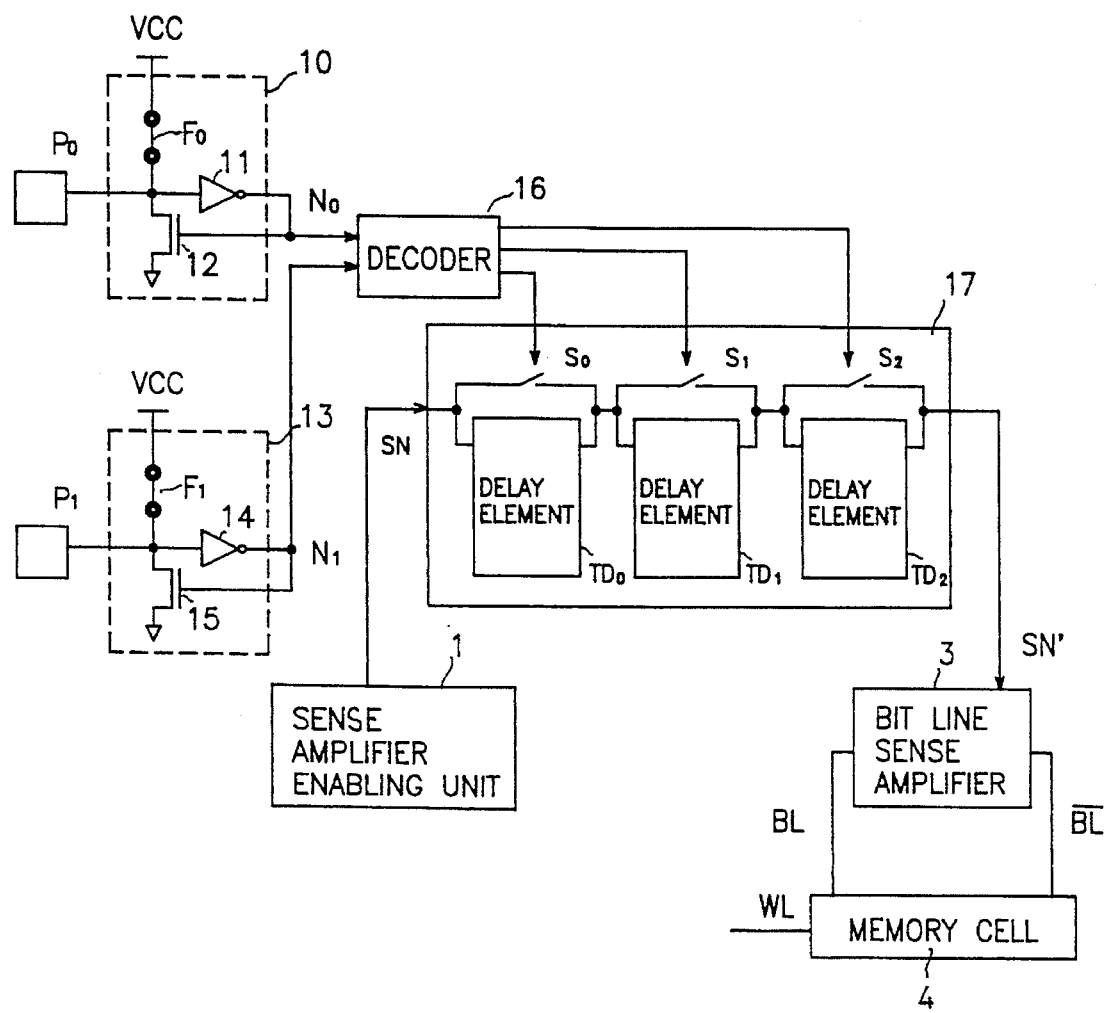

SEMICONDUCTOR MEMORY DEVICE

BACKGROUND OF THE INVENTION

1. Field of the Invention

The present invention relates to a semiconductor memory device, and more particularly to a semiconductor memory device capable of individually and readily performing control of a variety of design margins and access time according to each semiconductor memory device to thereby improve a reliability and performance of the semiconductor memory device.

2. Description of the Prior Art

In a semiconductor memory device, there is always a possibility of process variation. Actually, according to process steps to allow the memory device to be operated, the process variation occurs within a predetermined error range for a target value, in which process variation is essential to determine a performance of the memory device. Therefore, in designing the memory device, design margins are to be considered to permit the memory device to be operated even in a worst condition.

Therefore, after the process variation and the design margins are considered in designing a device, a simulation is performed, and the uppermost metal layer option is laid out in order to easily verify and to adjust the process variation and the design margins according to the result of the simulation. That is, at a stage of a sample product, the design margins are evaluated by an internal probing. Then, a metal layer is corrected by an FIB(Focus Ion Beam) outfit to be re-evaluated, and finally is corrected.

With reference to FIG. 1, a conventional semiconductor memory device includes a sense amplifier enabling unit 1 for outputting a sense amplifier enable signal SN according to decoding an address regarding word line; delays 2 for delaying the sense amplifier enable signal SN for a predetermined time provided from the sense amplifier enabling unit 1 and outputting a delayed sense amplifier enable signal SN'; a bit line sense amplfier 3 being enabled by the delayed sense amplifier enable signal SN' provided from the delays 2 and amplifying a minute electric potential difference in a pair of bit lines BL and BL; and a memory cell 4 being connected to the pair of bit lines BL and BL and a word line WL.

The delays 2 includes a plurality of sequentially connected delays $TD_0$–$TD_n$ and metal switches for bypass disposed at both ends of each delay $TD_0$–$TD_n$.

The memory cell 4 includes an NMOS transistor 401 having a gate connected to the word line WL and a source connected to the bit line BL, and a capacitor 402 for storing data one end of which is connected to a drain of the NMOS transistor 401 and the other end a power voltage is applied to. A plurality of memory cell constructed the same as in the above memory cell 4 are arranged in array in the semiconductor memory device.

An operation of the semiconductor memory device as constructed above will now be described with reference to FIG. 2.

When a row address strobe signal(not shown) provided from an external source of a semiconductor memory device becomes active, a row address(not shown) is decoded, so that a signal inputted to a word line WL of a plurality of word lines is transitted to a high level.

Then, the NMOS transistor 401 is turned on and the data stored at the capacitor 402 is loaded at the bit lines BL. That is, for instance, if the data stored at the capacitor 402 is '0', the electric potential of the bit line(BL) which has been precharged by chargestmring between the capacitor 402 and the bit line BL is reduced as much as $\Delta V$.

The sense amplifier enabling unit 1 outputs a sense amplifier enable signal SN of high level to a delay element $TD_0$ of the delay 2. The sense amplifier enabling signal SN is delayed by each delay element $TD_0$–$TD_n$ or is bypassed by each metal switch $S_0$–$S_n$, by which a delayed sense amplifier enabling signal SN' is input to a bit line sense amplifier 30. Accordingly, the bit line sense amplifier 3 is enabled to amplifer a predetermined voltage $\Delta V$, and the electric potential between the bit line BL and the bit line BL becomes large, as shown in FIG. 2.

In this respect, the charge dispersion between the capacitor 204 and the bit line BL is differently made depending on positions of memory cells each of which is connected to the bit line BL by RC delay. Therefore, if a farthest memory cell from the bit line sense amplifier 3 is selected, a size of the predetermined voltage $\Delta V$ becomes the worst.

The bit line sense amplifier 3 always has an offset in sense amplifier, the element for geometrical mismatch and mismatch in process. In spite of the offset, the size of the predetermined voltage $\Delta V$ between a pair of the bit line BL and BL is to be sufficient for sensing a proper data. However, since there is no means for supplying the charge but the capacitor 402 and the bit line capacitor(not shown), the predetermined voltage $\Delta V$ will be converged to a constant value rather than being continuously increased as time goes by.

Therefore, for the purpose of sensing the proper data, the delayed sense amplifier enable signal SN' is to be input to the bit line sense amplifier 3 enough late, however, in this case, a time margin between a signal Ysel(not shown) selecting the bit line and the sense amplifier enabling signal SN may be reduced while an access time of the row address strobe signal RAS is increased. In particular, if an input point of time of the delayed sense amplifier enable signal SN' would be determined by only a simulation, the input point of time is necessarily be enough prolonged, moreover, a time margin is additionally required for a reliable operation considering the process variation and a die variation.

Accordingly, in order to avoid such problems, after evaluation of the operation of the sample product of the semiconductor memory device, arbitrary metal switches of the metal switches $S_0$–$S_n$ disposed at both ends of the delay elements $TD_0$–$TD_n$ are turned on or off, so that the input point of time of the delayed sense amplifier enable signal SN' is adjusted and the adjusted input point of time is applied to a device for real product.

However, such conventional semiconductor memory device also has disadvantages in that, since a uniformly defined time margin is applied to every semiconductor memory device, the time margin is unnecessarily larger for a specific semiconductor memory device, resulting in delaying the access time. Also, the sample product is evaluated by using FIB outfit which is hard to work, only a few sample products can be evaluated. In addition, in order to apply data obtained from the evaluation to a new product, the metal layer should be corrected, which is dangerous and a developing period of a semiconductor memory device therefor is lengthened. Furthermore, even if a process at the stage of mass production is improved, the result of the evaluation can not be quickly adapted to a manufacturing process.

SUMMARY OF THE INVENTION

Therefore, an object of the present invention is to provide a semiconductor memory device in which a vendor test is performed by using fuse ROMs which are programmed by external signals so that based on accurate information regarding the semiconductor memory device as obtained by the vendor test, design margins and an access time can be easily varied according to each semiconductor memory device, thereby improving a reliability and a performance.

In order to obtain the above object, the semiconductor memory device includes a vendor test mode detector for detecting a vendor test mode according to a row address strobe signal, a column address strobe signal, a write enable signal and a specific address signal, each of which are applied from an external source and outputting a detect signal in accordance therewith; a vendor test mode selector for selecting a vendor test mode corresponding to an address signal applied from an external source according to the detect signal provided from the vendor test mode detector and outputting a select signal in accordance therewith; a multiplexer for controlling outputs of pad signals applied from an external source according to the select signal provided from the vendor test mode selector; a plurality of fuse ROM arrays being programmed by the signals provided from the multiplexer and outputting programmed data, the plurality of fuse ROM arrays being respectively corresponding in number to the vendor test modes; a decoder for decoding a signal provided from a one of the plurality of fuse ROM arrays in which data of an operational point of time of a bit line sense amplifier are stored, the bit line sense amplifier being operated in response to a delayed sense amplifier enable signal; a delay for delaying a sense amplifier enable signal provided from a sense amplifier enabling unit for a predetermined time according to an output signal of the decoder; and a memory cell array for outputting a stored data to the bit line sense amplifier.

BRIEF DESCRIPTION OF THE DRAWINGS

FIG. 3 is a block diagram of a first embodiment of a semiconductor memory device in accordance with the present invention;

FIG. 4 is a table showing an operation of a delay according to a state of a programmable ROM of FIG. 3;

DETAILED DESCRIPTION OF THE INVENTION

Figure 1:
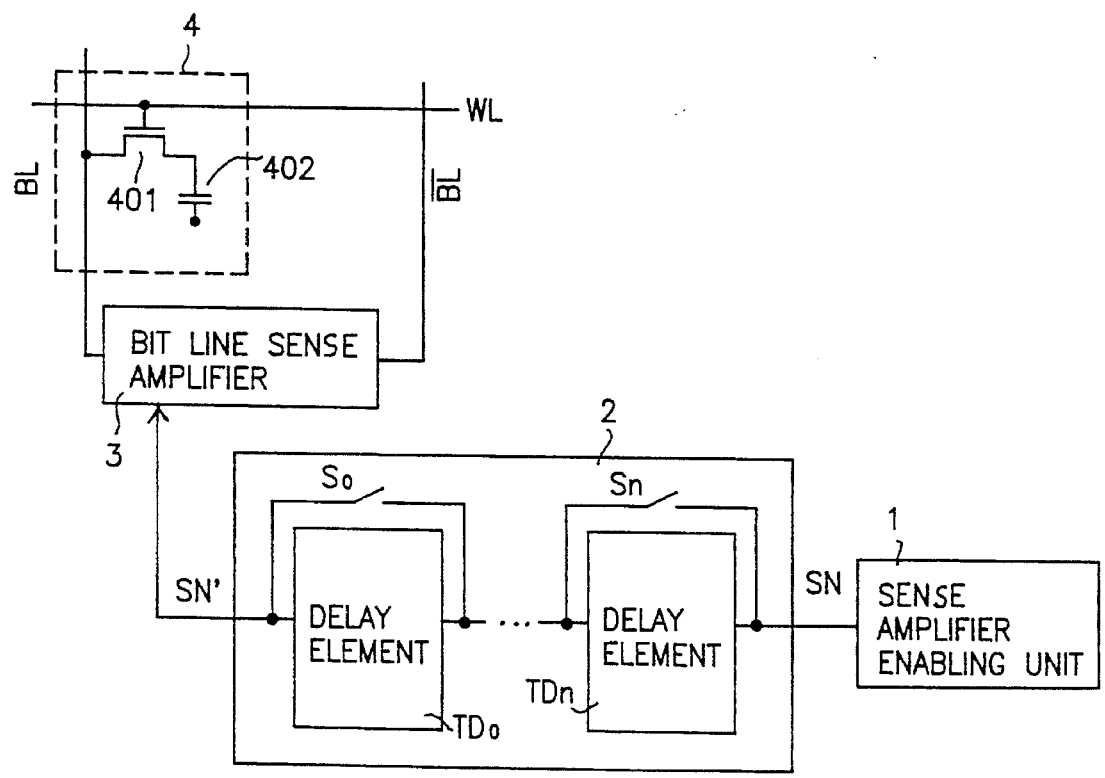
FIG. 1 is a partial block diagram of a conventional semiconductor memory device.
Figure 2:
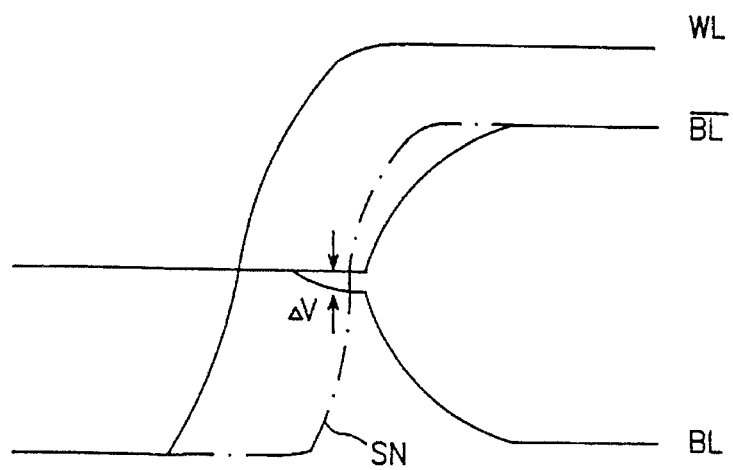
FIG. 2 is show a waveform illustrating state variation of signals of bit lines according to a word line signal and a sense amplifier enable signal of FIG. 1.

A first embodiment of a semiconductor memory device in accordance with the present invention includes fuse ROMs 10 and 13 being respectively programmed according to pad signals Po and P1 applied through a pad which is connected to an external unit; a decoder 16 for decoding an output signal of the fuse ROMs 10 and 13; a sense amplifier enabling unit 1 for outputting a sense amplifier enable signal SN; a delay 17 for delaying the sense amplifier enable signal SN for a predetermined time according to the output signal of the decoder 16; a bit line sense ampitier 3 being enabled by the delayed sense amplifier enable signal SN' provided from the delay 17 and for amplifying a minute potential difference between a pair of bit lines BL and BL; and a memory cell 4 being connected to both a pair of bit line BL and BL and a word line WL.

The fuse ROM 10 includes a fuse $F_0$ one end of which a power voltage is applied to and the other end a pad signal $P_0$ is applied to, an inverter 11 for inverting a signal applied from the other end of fuse $F_0$ or the pad signal $P_0$, and an NMOS transistor 12 having a gate to which an output signal of the inverter 11 is input, a drain connected to the other end of the fuse $F_0$ and a source connected to ground.

The fuse ROM 13 is constructed the same as in the fuse ROM 10 by including a fuse $F_1$, an inverter 14 and an NMOS transistor 15.

The delay 17 includes delay elements $TD_0$, $TD_1$ and $TD_2$ for delaying the sense amplifier enabling signal SN for a predetermined time $t_0$, $t_1$ and $t_2$ according to metal switches $S_0$, $S_1$ and $S_2$ which are turned on or off according to the output signal of the decoder 16.

The same reference numerals as those in FIG. 1 are given to the same parts as in the conventional semiconductor memory device.

An operation of the first embodiment according to the present invention as constructed above will now be described in detail with reference to FIG. 4.

When the fuses $F_0$ and $F_1$ are in an intact condition, high level signals to which power voltage is applied are inverted by the inverters 11 and 14, respectively, so that a low level signal is provided to nodes N0 and N1 and the NMOS transistors 12 and 15 are turned off. Then, the signals of the nodes $N_0$ and $N_1$ are decoded by the decoder 16, and according to the decoded signals the metal switch $S_0$ is turned off while the metal switches $S_1$ and $S_2$ are turned on. Therefore, the sense amplifier enable signal SN provided from the sense amplifier enabling unit 1 is delayed by the delay element $TD_0$ for a predetermined time $t_0$ and by-passed by the metal switches $S_1$ and $S_2$.

If the fuse $F_0$ is in a blowing condition and the fuse F1 is in an intact condition, a low level signal is inverted by the inveter 11, so that a high level signal is provided to the node $N_0$, the NMOS transistor 12 is turned on, and a low level signal is provided to the node $N_1$. Subsequently, according to a signal provided from the decoder 16, the metal switches $S_0$ and $S_1$ are turned off while the metal switch $S_2$ is turned on. Therefore, the outputted sense amplifier enable signal SN is sequentially delayed by the delay element $TD_0$ for a predetermined time $t_0$ and by the delay element $TD_1$ for a predetermined time $t_1$, and then by-passed by the metal switch S2.

On the other hand, if the fuse $f_0$ is in an intact condition and the fuse $F_1$ is in a blowing condition, a low level signal is inverted by the inverter 14, so that a high level signal is provided to the node N1, the NMOS transistor 15 is turned on, and a low level signal is provided to the node $N_0$. Subsequently, according to a signal provided from the decoder 16, the metal switches $S_0$, $S_1$ and $S_2$ are all turned off. Therefore, the outputted sense amplifier enabling signal SN is sequentially delayed by the delay element $TD_0$ for a determined time $t_0$, by the delay element $TD_1$ for a predetermined time $t_1$, and by the delay element $TD_2$ for a predetermined time $t_2$.

In the meantime, if both fuses $F_0$ and $F_1$ are in a blowing condition, a high level signal is provided to the nodes $N_0$ and $N_1$, respectively, by the same operation as described above. And, subsequently, according to a signal provided from the decoder 16, the metal switches $S_0$, $S_1$ and $S_2$ are turned on. Therefore, the outputted sense amplifier enable signal SN is sequentially by-passed by the metal switchs $S_0$, $S_1$ and $S_2$, so that no delay time will exist.

The delayed sense amplifier enabling signal SN' provided from the delay 17 is input to the bit line sense amplifier 3, and by the same operation as described referring to FIG. 1, the memory cell 4 is accessed.

Likewise, according to the condition of the fuses $F_0$ and $F_1$, the fuse ROMs 10 and 13 is programmable to output a low or a high level signal. In this respect, once the fuses $F_0$ and $F_1$ $_{are}$ turned off, they would hardly be turned on. Thus, if the fuse ROMs 10 and 13 are programmed without any information by a prior test, a damage may occur.

In order to avoid such problem, it is preferably constructed that the fuse ROMs 10 and 13 are forcibly programmed according to pad signals $P_0$ and $P_1$ which are applied from an external source. That is, when the fuse $F_0$ is in intact condition, if the pad signal of low level is input, the input pad signal $P_0$ is inverted by the inverter 11, so that a high level signal is output to the node $N_0$ and the NMOS transistor 12 is turned on by which a high level signal is maintained at the node $N_0$. On the other hand, a high level pad signal $P_0$ is input, the inputted pad signal $P_0$ is inverted by the inverter 11, so that a low level signal is output to the node $N_0$, the NMOS transistor 12 is turned off, and a low level signal is maintained at the node $N_0$. The fuse ROM 13 can be programmed by the same operation as described above.

By doing that, by a manufacturer, after the fuse ROMs 10 and 13 are programmed by inputting the pad signals $P_0$ and $P_1$, the semiconductor memory device is tested to obtain an accurate information regarding the semiconductor memory device, then the fuse ROMs 10 and 13 are again programmed on the basis of the obtained information.

Figure 5:
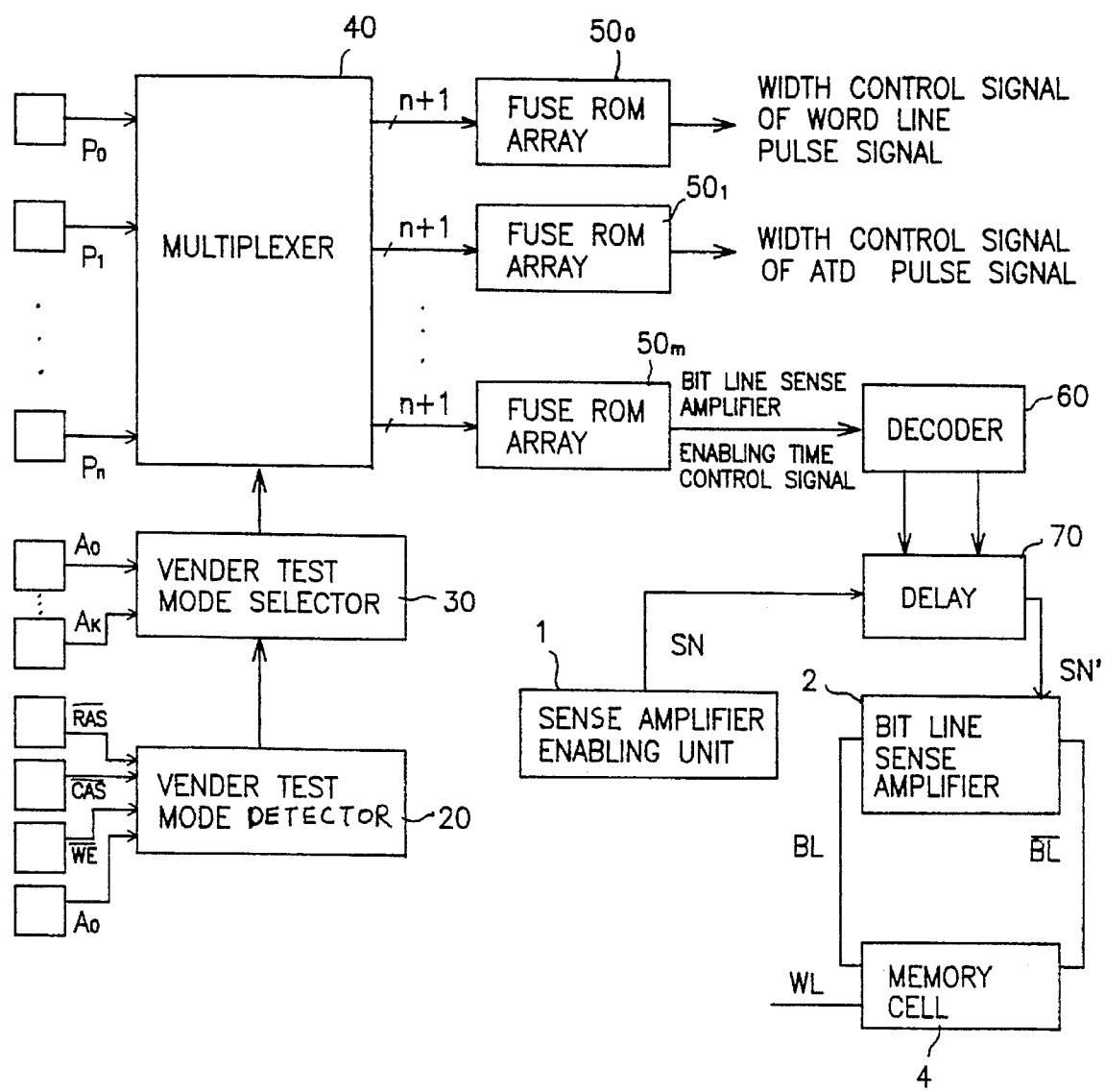
FIG. 5 is a block diagram of a second embodiment of a semiconductor memory device in accordance with the present invention.
Figure 6A:
FIG. 6(A) is a waveform of a row address strobe signal.
Figure 6B:
FIG. 6(B) is a waveform of a column address strobe signal.
Figure 6C:
FIG. 6(C) is a waveform of a write enable signal.
Figure 6D:
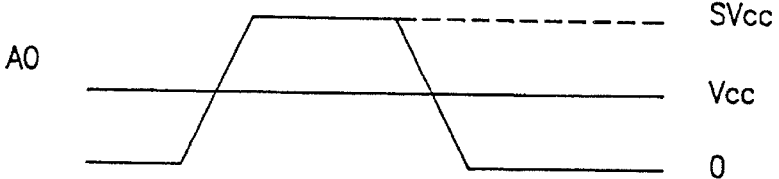
FIG. 6(D) is a waveform of a specific address signal of address signals.

In a second embodiment of the semiconductor memory device according to the present invention, a vendor test mode is combined with the first embodiment, which includes, as shown in FIG. 5, a vendor test mode detector 20 for detecting a vendor test mode according to a row address strobe signal, a column address strobe signal, a write enable signal and a specific address signal, each of which is applied from an external source and outputting a detect signal in accordance therewith; a vendor test mode selector 30 for selecting a vendor test mode corresponding to an address signal applied from an external source according to the detect signal provided from the vendor test mode detector 20 and outputting a select signal in accordance therewith; a multiplexer 40 for controlling outputs of pad signals $P_0$–$P_n$ applied from an external source according to the select signal provided from the vendor test mode selector 30; a plurality of fuse ROM arrarys $50_0$–$50_m$ being programmed by the signals provided from the multiplexer 40 and outputting programmed data, the plurality of fuse ROM arrays being respectively corresponding in number to the vendor test modes; a decoder 60 for decoding a control signal for enableing time of a bit line sense amplifier 2 of the fuse ROM arrays $50_0$–$50_m$, the bit line sense amplifier 2 being operated according to a delayed sense amplifier enable signal SN' provided from the delay 70; a delay 70 for delaying a sense amplifier enable signal SN provided from a sense amplifier enabling unit 1 for a predetermined time according to an output signal of the decoder 60; and a memory cell array 4 for outputting a stored data to the bit line sense amplifier.

The fuse ROM arrays $50_0$–$50_m$ include nth fuse ROMs such as the fuse ROM 10 in FIG. 3, and the delay 70 includes a plurality of delay elements and a plurality of metal switches which are connected in such a way as in FIG. 3.

The fuse ROM arrays $50_0$–$50_m$ store data required for a variety of design margins and controlling of a speed critical paths. For instance, the fuse ROM array $50_0$ stores data for controlling a width of a word line pulse signal. The fuse ROM array $50_1$ stores data for controlling a width of an address transition detect pulse signal, and the fuse ROM $50_m$ stores data for controlling an operational point of time of the bit line sense amplifier.

An operation of the semiconductor memory device constructed above will now be described with reference to the accompanying drawings.

Referring to FIG. 6, a vendor test mode detector 20 detects a vendor test mode by means of a WCBR(WE, CAS BEFORE RAS) mode depending on a JEDEC(Joint Electron Device Engineering Council) standard. That is, a column address strobe signal(CAS) as shown in FIG. 6(B) becomes active before a row address strobe signal(RAS) as shown in FIG. 6(A) becomes active. And then, a write enable signal WE shown in FIG. 6(C) is enabled, and a specific address signal $A_0$ shown in FIG. 6(D) has a voltage SVcc of higher level than a power voltage Vcc, so that the test mode is detected at the vendor test mode detector 20.

The vendor test mode selector 30 selects a vendor test mode corresponding to address signals $A_0$–$A_k$ provided from an external source. For instance, if "0001" is input to the address signals $A_0$–$A_k$, a test mode for controlling of the width of the word line pulse signal is selected. If "0010" is input, a test mode for controlling the width of the address transition detecting pulse signal is selected, while if "0011" is input, a test mode for controlling the margin of the bit line sense amplifier is selected.

The multiplexer 40 controls to enable the pad signals $P_0$–$P_n$ to be input to a fuse ROM array corresponding to a test mode selected by the vendor test mode selector 30, according to which the fuse ROM array coresponding to the pad signals $P_0$–$P_n$ is programmed. If a fuse ROM array $50_m$ is programmed, data for controlling the enabling time of the bit line sense amplifier is input to the decoder 60, then the bit line sense amplifier 2 is operated in the same way as in FIG. 3.

Likewise, as the fuse ROM arrays $50_0$–$50_m$ are repeatedly programmed, the vendor test as desired is performed, by which an accurate information on the semiconductor memory device can be obtained, and based on which a state of the fuses included in the fuse ROM arrays $50_0$–$50_m$ are finally programmed.

As so far described, in the present invention, the fuse ROMs are repeatedly programmed for vendor testing, so that an accurate information regarding the semiconductor memory device can be obtained, thereby reliably improving the design margins and the access time according to semiconductor memory device.

For instance, when a semiconductor memory device having a 50 nsec row address strobe signal(RAS) access signal is made, a mode for controlling margins of a bit line sense amplifier is selected in the vendor test mode and a corresponding fuse ROM to advance the operational point of time of the bit line sense amplifier is programmed, and then row address strobe signal(RAS) access time is measured. In this respect, if the row address strobe signal(RAS) access time is improved up to approximately 45 nsec, the semiconductor memory device can be sold as a 50 nsec product, so that much profit can be obtained. On the other hand, if the row address strobe signal(RAS) access time is not improved so that the semiconductor memory device is classified into 60 nsec product group rather than being classified into a 50 nsec product, an operational point of time of the bit line sense amplifier can be delayed, by which even if it is classified into a 53 nsec row address strobe signal(RAS) access time, since it will have a large margin, it would be regarded as a reliable product.

As a result, according to the present invention, characteristics variation of the semiconductor memory device is evaluated by the vendor test mode, according to which a corresponding fuse ROM is finally programmed, resulting in an effectiveness that a reliability and a speed thereof can be improved.

What is claimed is:

1. A semiconductor memory device comprising:

a vendor test mode detector for detecting a vendor test mode in response to a row address strobe signal, a column address strobe signal, a write enable signal and a specific address signal, each of which are applied from an external source and outputting a detect signal in accordance therewith;

a vendor test mode selector for selecting a vendor test mode corresponding to an address signal applied from an external source according to the detect signal provided from the vendor test mode detector and outputting a select signal in accordance therewith;

a multiplexer for controlling outputs of pad signals applied from an external source according to the select signal provided from the vendor test mode selector;

a plurality of fuse ROM arrays being programmed by the signals provided from the multiplexer and outputting programmed data, the plurality of fuse ROM arrays being respectively corresponding in number to the vendor test modes;

a decoder for decoding a signal provided from a one of the plurality of fuse ROM arrays in which data of an operational point of a bit line sense amplifier are stored, said bit line sense amplifier being operated in response to a delayed sense amplifier enable signal;

a delay means for delaying a sense amplifier enable signal provided from a sense amplifier enabling unit for a predetermined time according to an output signal of the decoder; and a memory cell array for outputting a stored data to the bit line sense amplifier.

2. The semiconductor memory device according to claim 1, wherein the plurality of the fuse ROM arrays each stores therein data required for controlling a variety of design margins and speed critical paths such as data regarding controlling of a width of a word line pulse signal and a width of an address transition detecting pulse signal besides data regarding the operational point of the bit line sense amplifier.

3. The semiconductor memory device according to claim 2, wherein the plurality of the fuse ROM arrays are programmed according to the condition of fuses therein, or forcibly programmed according to a signal applied through a pad thereof which is connected to an external source.

4. The semiconductor memory device according to claim 3, wherein the plurality of fuse ROM arrays each includes:

a fuse receiving a source voltage at one end thereof and receiving pad signals at another end thereof;

an inverter for inverting the pad signal or a signal applied from one end of the fuse; and an NMOS transistor having a gate to which an output signal of the inverter is input, a drain connected to the other end of the fuse and a source connected to ground.

5. The semiconductor memory device according to claim 1, wherein the delay means includes a plurality of metal switches for by-passing which are turned on or off by the signal provided from the decoder.

* * * * *